(12) United States Patent
Van Aerde et al.

(10) Patent No.: US 10,460,932 B2
(45) Date of Patent: Oct. 29, 2019

(54) SEMICONDUCTOR DEVICE WITH AMORPHOUS SILICON FILLED GAPS AND METHODS FOR FORMING

(71) Applicant: ASM IP Holding B.V., Almere (NL)

(72) Inventors: Steven R. A. Van Aerde, Tielt-Winge (BE); Kelly Houben, Lubbeek (BE); Maarten Stokhof, Winksele (BE); Bert Jongbloed, Oud-Heverlee (BE); Dieter Pierreux, Dilbeek (BE)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 15/476,702

(22) Filed: Mar. 31, 2017

(65) Prior Publication Data
US 2018/0286672 A1 Oct. 4, 2018

(51) Int. Cl.
*H01L 21/20* (2006.01)
*H01L 21/02* (2006.01)
(Continued)

(52) U.S. Cl.
CPC .... *H01L 21/02532* (2013.01); *H01L 21/0243* (2013.01); *H01L 21/0262* (2013.01);
(Continued)

(58) Field of Classification Search
CPC ......... B82Y 40/00; B82Y 30/00; B82Y 20/00; G06T 7/246; G06T 19/20; G06T 2200/28;
(Continued)

(56) References Cited

U.S. PATENT DOCUMENTS

| 3,900,597 A | 8/1975 | Chruma et al. |
| 4,062,707 A | 12/1977 | Mochizuki et al. |

(Continued)

FOREIGN PATENT DOCUMENTS

| EP | 0 634 785 A1 | 1/1995 |
| EP | 0 933 804 A2 | 12/1998 |

(Continued)

OTHER PUBLICATIONS

Arienzo et al., "In Situ Arsenic-Doped Polysilicon for VLSI Applications," Transactions on Electron Devices ED33(1):1535-1538 (1986).

(Continued)

*Primary Examiner* — Robert G Bachner
(74) *Attorney, Agent, or Firm* — Knobbe Martens Olson & Bear, LLP

(57) ABSTRACT

Amorphous silicon-filled gaps may be formed having no or a low occurrence of voids in the amorphous silicon fill, while maintaining a smooth exposed silicon surface. A gap in a substrate may be filled with amorphous silicon by heating the substrate to a deposition temperature between 300 and 500° C. and providing a feed gas that comprises a first silicon reactant to deposit an amorphous silicon film into the gap with an hydrogen concentration between 0.1 and 10 at. %. The deposited silicon film may subsequently be annealed. After the anneal, any voids may be reduced in size and this reduction in size may occur to such an extent that the voids may be eliminated.

23 Claims, 8 Drawing Sheets

(51) Int. Cl.
*H01L 21/28* (2006.01)
*H01L 29/78* (2006.01)

(52) U.S. Cl.
CPC .. *H01L 21/02592* (2013.01); *H01L 21/28035* (2013.01); *H01L 29/785* (2013.01)

(58) Field of Classification Search
CPC . G06T 2207/10016; G06T 2207/10021; G06T 2207/20021; G06T 2207/20088; G06T 7/0012; G06T 7/277; G06T 7/85; G06T 15/08; G06T 15/20; G06T 17/10; G06T 19/006; G06T 2207/10032; G06T 2207/10072; G06T 2207/20104; G06T 2207/30096; G06T 2207/30101; G06T 2207/30181; G06T 2207/30242; G06T 2207/30261; G06T 2219/2004; G06T 2219/2021; G06T 3/0037; G06T 7/0002; G06T 7/11; G06T 7/12; G06T 7/13; G06T 7/194; G06T 7/20; G06T 7/50; G06T 7/60; G06T 7/70; G06T 9/40; G08G 1/165; G08G 1/166; G08G 1/0962; G08G 1/167; H04L 67/10; H04L 41/0213; H04L 41/0806; H04L 41/12; H04L 45/52; H04L 51/046; H04L 63/104; H04L 69/18; H04L 12/185; H04L 12/4604; H04L 1/0006; H04L 1/0011; H04L 1/1635; H04L 1/1642; H04L 1/1657; H04L 1/1825; H04L 1/1854; H04L 1/1893; H04L 2027/003; H04L 2209/04; H04L 2209/16; H04L 25/02; H04L 27/0002; H04L 27/26; H04L 27/2655; H04L 27/2692; H04L 29/06; H04L 29/08; H04L 29/10; H04L 41/0668; H04L 41/0681; H04L 41/069; H04L 41/0803; H04L 41/0823; H04L 41/0836; H04L 41/5054; H04L 43/04; H04L 43/06; H04L 43/08; H04L 43/10; H04L 47/783; H04L 49/60; H04L 51/16; H04L 51/20; H04L 51/34; H04L 51/36; H04L 5/003; H04L 5/0048; H04L 5/0053; H04L 5/14; H04L 63/1416; H04L 63/145; H04L 65/102; H04L 65/4076; H04L 65/608; H04L 67/02; H04L 67/12; H04L 67/14; H04L 67/16; H04L 67/18; H04L 67/22; H04L 67/38; H04L 69/04; H04L 69/323; H04L 69/40; H04L 9/0866; H04L 9/0894
See application file for complete search history.

(56) References Cited

U.S. PATENT DOCUMENTS

| | | |
|---|---|---|
| 4,217,374 A | 8/1980 | Ovshinsky et al. |
| 4,237,150 A | 12/1980 | Wiesmann |
| 4,341,818 A | 7/1982 | Adams et al. |
| 4,379,020 A | 4/1983 | Glaeser et al. |
| 4,404,236 A | 9/1983 | Komatsu et al. |
| 4,444,812 A | 4/1984 | Gutsche |
| 4,466,922 A | 8/1984 | Weitz et al. |
| 4,592,933 A | 6/1986 | Meyerson et al. |
| 4,634,605 A | 1/1987 | Wiesmann |
| 4,745,088 A | 5/1988 | Inoue et al. |
| 4,829,017 A | 5/1989 | Malhi |
| 4,834,020 A | 5/1989 | Bartholomew et al. |
| 4,843,022 A | 6/1989 | Yamazaki |
| 4,963,506 A | 10/1990 | Liaw et al. |
| 5,013,691 A | 5/1991 | Lory et al. |
| 5,017,308 A | 5/1991 | Iijima et al. |
| 5,037,666 A | 8/1991 | Mori |
| 5,065,273 A | 11/1991 | Rajeevakumar |
| 5,075,749 A | 12/1991 | Chi et al. |
| 5,080,933 A | 1/1992 | Grupen-Shemansy et al. |
| 5,082,696 A | 1/1992 | Sharp |
| 5,097,381 A | 3/1992 | Vo |
| 5,192,708 A | 3/1993 | Beyer et al. |
| 5,198,387 A | 3/1993 | Tang |
| 5,250,452 A | 10/1993 | Ozturk et al. |
| 5,254,369 A | 10/1993 | Arai et al. |
| 5,256,588 A | 10/1993 | Witek et al. |
| 5,266,526 A | 11/1993 | Aoyama |
| 5,290,358 A | 3/1994 | Rubloff et al. |
| 5,298,790 A | 3/1994 | Harmon et al. |
| 5,310,698 A | 5/1994 | Wild |
| 5,314,845 A | 5/1994 | Lee et al. |
| 5,324,684 A | 6/1994 | Kermani et al. |
| 5,326,722 A | 7/1994 | Huang |
| 5,371,039 A | 12/1994 | Ogaro |
| 5,525,540 A | 6/1996 | Zenke et al. |
| 5,576,059 A | 11/1996 | Beinglass et al. |
| 5,593,727 A | 1/1997 | Desu et al. |
| 5,607,511 A | 3/1997 | Meyerson |
| 5,607,724 A | 3/1997 | Beinglass et al. |
| 5,614,257 A | 3/1997 | Beinglass et al. |
| 5,627,092 A | 5/1997 | Alsmeier et al. |
| 5,635,242 A | 6/1997 | Agnello et al. |
| 5,677,219 A | 10/1997 | Mazure et al. |
| 5,695,819 A | 12/1997 | Beinglass et al. |
| 5,700,520 A | 12/1997 | Beinglass et al. |
| 5,753,526 A | 5/1998 | Ozaki |
| 5,786,027 A | 7/1998 | Rolfson |
| 5,838,045 A | 11/1998 | Muller et al. |
| 5,863,598 A | 1/1999 | Venkatesan et al. |
| 5,874,129 A | 2/1999 | Beinglass et al. |
| 5,876,797 A | 3/1999 | Beinglass et al. |
| 5,888,876 A | 3/1999 | Shiozawa et al. |
| 5,888,906 A | 3/1999 | Sandhu et al. |
| 5,905,279 A | 5/1999 | Nitayama et al. |
| 5,910,019 A | 6/1999 | Watanabe et al. |
| 5,913,125 A | 6/1999 | Brouillette |
| 5,972,116 A | 10/1999 | Takagi |
| 6,004,029 A | 12/1999 | Moslehi |
| 6,022,806 A | 2/2000 | Sato et al. |
| 6,057,216 A | 5/2000 | Economikos et al. |
| 6,067,680 A | 5/2000 | Pan et al. |
| 6,121,081 A | 9/2000 | Thakur |
| 6,150,686 A | 11/2000 | Sigiura et al. |
| 6,204,206 B1 | 3/2001 | Hurley |
| 6,232,196 B1 | 5/2001 | Raaijmakers et al. |
| 6,297,088 B1 | 10/2001 | King |
| 6,306,761 B1 | 10/2001 | Taguchi |
| 6,461,437 B1 | 10/2002 | Kubota |
| 6,489,066 B2 | 12/2002 | Mirkanimi |
| 6,809,005 B2 | 10/2004 | Ranade et al. |
| 6,861,334 B2 | 3/2005 | Raaijmakers et al. |
| 7,087,536 B2 | 8/2006 | Nemani et al. |
| 7,157,327 B2 | 1/2007 | Haupt |
| 7,288,463 B1 | 10/2007 | Papassouliotis |
| 8,076,251 B2 | 12/2011 | Akae et al. |
| 8,187,948 B2 | 5/2012 | Chen et al. |
| 8,415,258 B2 | 4/2013 | Akae et al. |
| 8,592,005 B2 | 11/2013 | Ueda |
| 8,664,127 B2 | 3/2014 | Bhatia et al. |
| 8,722,510 B2 | 5/2014 | Watanabe et al. |
| 8,945,305 B2 | 2/2015 | Marsh |
| 8,945,339 B2 | 2/2015 | Kakimoto et al. |
| 9,023,738 B2 | 5/2015 | Kato et al. |
| 9,190,264 B2 | 11/2015 | Yuasa et al. |
| 9,257,274 B2 | 2/2016 | Kang et al. |
| 2002/0139775 A1 | 10/2002 | Chang |
| 2002/0171122 A1* | 11/2002 | Voutsas ............... C23C 14/165 257/588 |
| 2003/0044621 A1* | 3/2003 | Won ..................... C23C 16/401 428/446 |
| 2004/0033674 A1* | 2/2004 | Todd ..................... C30B 25/02 438/478 |
| 2005/0112282 A1 | 5/2005 | Gordon et al. |
| 2005/0118770 A1* | 6/2005 | Nandakumar ...... H01L 21/3003 438/305 |

(56) References Cited

U.S. PATENT DOCUMENTS

| | | | |
|---|---|---|---|
| 2006/0046518 A1 | 3/2006 | Hill et al. | |
| 2006/0223333 A1* | 10/2006 | Li | C23C 16/24 438/762 |
| 2007/0026651 A1 | 2/2007 | Leam | |
| 2008/0185635 A1 | 8/2008 | Yanagi | |
| 2008/0242097 A1 | 10/2008 | Quimonda | |
| 2009/0029508 A1* | 1/2009 | Yamazaki | H01L 27/1214 438/158 |
| 2011/0049461 A1 | 3/2011 | Breitwisch | |
| 2011/0275215 A1* | 11/2011 | Gatineau | C07F 17/00 438/681 |
| 2012/0149213 A1 | 6/2012 | Nittala | |
| 2013/0005142 A1 | 1/2013 | Kakimoto et al. | |
| 2013/0105796 A1 | 5/2013 | Liu et al. | |
| 2014/0065779 A1* | 3/2014 | Zhang | H01L 29/66795 438/283 |
| 2014/0179085 A1 | 6/2014 | Hirose et al. | |
| 2014/0193983 A1 | 7/2014 | Lavoie | |
| 2014/0256156 A1 | 9/2014 | Harada et al. | |
| 2014/0273531 A1 | 9/2014 | Niskanen et al. | |
| 2015/0179427 A1 | 6/2015 | Hirose et al. | |
| 2015/0243545 A1 | 8/2015 | Tang et al. | |
| 2015/0255324 A1 | 9/2015 | Li et al. | |
| 2016/0013042 A1 | 1/2016 | Hashimoto et al. | |
| 2016/0020093 A1* | 1/2016 | Van Aerde | H01L 21/02667 438/486 |
| 2016/0020094 A1 | 1/2016 | Van Aerde et al. | |
| 2016/0093528 A1 | 3/2016 | Chandrashekar et al. | |
| 2016/0141176 A1 | 5/2016 | Van Aerde et al. | |
| 2016/0276148 A1 | 9/2016 | Qian | |

FOREIGN PATENT DOCUMENTS

| | | |
|---|---|---|
| EP | 0 923 113 A2 | 6/1999 |
| EP | 0 794 567 A2 | 1/2000 |
| JP | 51-1389 | 5/1905 |
| JP | 54-004066 | 1/1979 |
| JP | 60-036662 | 2/1985 |
| JP | 62-230979 | 10/1987 |
| JP | 63-003414 | 1/1988 |
| JP | 63-239811 | 10/1988 |
| JP | 63-258016 | 10/1988 |
| JP | 02-119223 | 5/1990 |
| JP | 02-122076 | 5/1990 |
| JP | 02-208293 | 8/1990 |
| JP | 07-078863 | 3/1995 |
| JP | 08-055803 | 2/1996 |
| JP | 08-088333 | 4/1996 |
| JP | 08-186081 | 7/1996 |
| JP | 08-201399 | 8/1996 |
| JP | 09-036230 | 2/1997 |
| JP | 09-162126 | 6/1997 |
| JP | 09-246498 | 9/1997 |
| JP | 10-012731 | 1/1998 |
| JP | 10-027885 | 1/1998 |
| JP | 10-050830 | 2/1998 |
| WO | WO 2014/107290 | 7/2014 |

OTHER PUBLICATIONS

Bloem, J. "High Chemical Vapour Deposition Rates of Epitaxial Silicon Layers," J. of Crystal Growth, vol. 18, pp. 70-76 (1973).

Bunshah et al., "Deposition Technologies for Films and Coatings: Developments and Applications," Noyes Publications, p. 357 (1982).

Claasen et al., "The Deposition of Silicon from Silane in a Low-Pressure Hot-Wall System," J. of Crystal Growth, vol. 57, pp. 259-266 (1982).

Coffa et al., "Defectr Production and Annealing in Ion-Implanted Amorphous Silicon," Physical Review Letters, vol. 70 No. 24, pp. 3756-3759; 1993.

Decision on Appeal—U.S. Appl. No. 10/347,849, dated May 31, 2006, 15 pages.

European Search Report dated Nov. 17, 2015 in corresponding European Patent Application No. 151547221.4.

Kern, W., "Advances in Deposition Processes for Passivation Films," J. Vac. Sci. Technol., vol. 14, No. 5, pp. 1082-1099 (1977).

Kleijn, C.R., "A Mathematical Model of the Hydrodynamics and Gas-Phase Reactions in Silicon LPCVD in a Single-Wafer Reactor," J. Electrochem. Soc., vol. 138, No. 7, pp. 2190-2200 (Jul. 1991).

Lin et al., "Front-End Integration Effects on Gate Oxide Quality," Mat. Res. Soc. Symp. Proc., vol. 428, pp. 361-366.

Morosanu, C.E., "Thin Films by Chemical Vapor Deposition," Elsevier, pp. 48, 107 (1990).

Schuegral, K.K., Handbook of Thin-Film Deposition Processes and Techniques, Noyes Publication, pp. 80-81, 86, 93 (1988).

Voutsas, "Low Temperature Polysilicon Technology for Advanced Display Systems," Shapu Giho/Sharp Technical Journal, NBo. 69, pp. 51-56; 1987.

Wolf et al., Silicon Processing for the VLSI Era, vol. 1, Lattice Press, pp. 182 (1986).

Wu, "Suppression of the Boron Penetration Induced Dielectric Degradation by Using a Stacked-Amorphous-Silicon Film as the Gate Structure for pMOSFET," IEEE Transactions on Electron Devices, vol. 43 No. 2; pp. 303-310; 1996.

* cited by examiner

SEMICONDUCTOR DEVICE WITH AMORPHOUS SILICON FILLED GAPS AND METHODS FOR FORMING

FIELD

The present disclosure generally relates to methods to manufacture semiconductor devices. More particularly, the disclosure relates to filling gaps in substrates with silicon.

BACKGROUND

Semiconductor devices typically include gaps that have been filled with silicon, which may form constituent parts of various electronic devices. The fill may include depositing a layer of silicon on side and bottom surfaces of the gaps, with the layer filling in the gap from the sides and bottom as it grows.

The growth of the layer may not be completely uniform, however, causing voids, such as seams, to form in the interior of the filled gap. In some cases, these voids may be caused by the deposition process, in which silicon may deposit at a higher rate at the top of the gap than at the bottom, thereby causing the top of the gap to close up first, leaving the voids in the interior of the gap or the nucleation on the bottom or side of the gap may be incomplete causing voids in the bottom or side of the gap.

FIG. 1 shows a cross-section of a gap filled with a deposited silicon film. As seen in the region 1 at the center of the cross-section, a void such as a vertically-elongated seam is present. Further, in the region 2, another void is present closer to the structure. Such voids can adversely impact the electronic devices formed by the filled gap in between fins 3 composing the structure.

Accordingly, there is a need for processes for forming silicon filled gaps, while leaving no or nearly no voids in the gaps.

SUMMARY

In some embodiments, a method for semiconductor processing is provided. The method comprising providing in a deposition chamber a substrate having a gap and depositing an amorphous silicon film onto the substrate having a thickness sufficient to fill the gap. In some embodiments depositing the silicon film comprises heating the substrate to a deposition temperature between 300 and 500° C. In further embodiments depositing the silicon film comprises providing a feed gas that comprises a first silicon reactant to deposit silicon forming the amorphous silicon film. The deposited silicon has a hydrogen concentration between 0.1 and 10 at. %. The atomic percentage (at. %) gives the percentage of one kind of atom relative to the total number of atoms. Further, the substrate may be annealed at an anneal temperature between 500 and 700° C.

In some other embodiments, a method for semiconductor processing is provided. The method includes depositing a silicon film on a substrate and into a gap in the substrate, thereby filling the gap. Portions of the silicon film in the gap form a void. The method may further include exposing a surface of the amorphous silicon film to a silicon mobility inhibitor and subsequently reducing a size of the void by annealing the silicon film.

DETAILED DESCRIPTION

Figure 1:
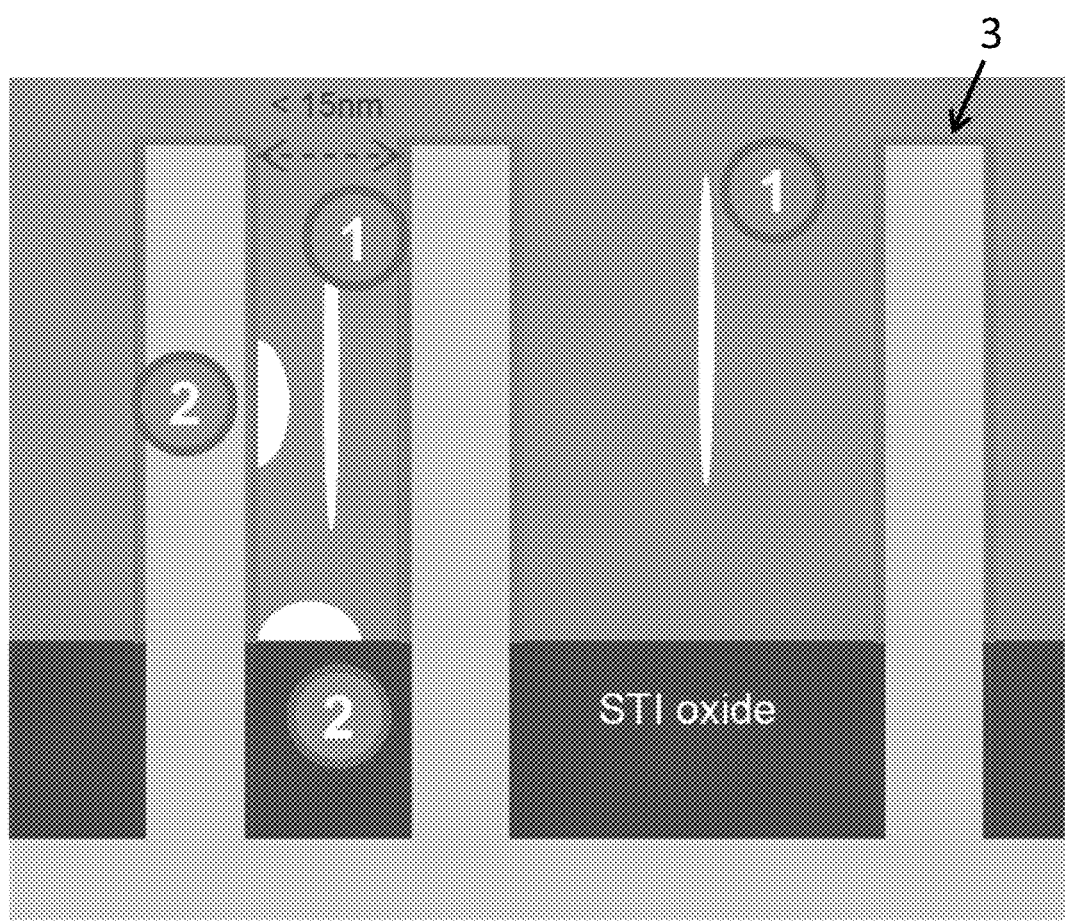
FIG. 1 shows a cross-section of a gap filled with a deposited silicon film.

A proposed approach for eliminating voids in openings filled with silicon is to perform an anneal after depositing the silicon into the gaps. As used herein, the silicon in the gaps may also be referred to as a silicon fill.

It has been found, however, that such an anneal produced other undesirable changes in the deposited silicon. For example, the anneal was found to cause the silicon to crystallize. The crystallization may be unwanted because in a subsequent etch step, for example to etch a replacement gate, the etching may progress along the grain boundaries of the grains composing the polycrystalline silicon, which causes unwanted roughness.

By depositing an amorphous silicon film into the gap at a deposition temperature between 300 and 500° C. hydrogen may remain in the silicon forming an amorphous silicon film and thereby inhibit the formation of crystals and thus keep the layer amorphous during the subsequent anneal. The amorphous silicon film may have a hydrogen concentration between 0.1 and 10 at. % preferably between 0.5 and 5 at. %, and more preferably between 1 and 3 at. %, including around 1.5 at %. The atomic percentage (at. %) gives the percentage of one kind of atom relative to the total number of atoms. Such a film may be referred to as a hydrogen-doped film. Crystallization of the amorphous silicon film during the subsequent anneal may thereby be avoided. The amorphous silicon film may later be etched and because the layer is amorphous an etch surface may be smooth, which may be advantageous.

In some embodiments, the silicon-filled gaps are formed having no or exceptionally small voids in the silicon fill, while maintaining the amorphous morphology of the silicon fill. In some embodiments, a gap in a substrate may be filled with silicon, which may be amorphous silicon. In some embodiments, the silicon fill may include a plurality of deposited layers (e.g., including a doped silicon layer), with a final, top layer of amorphous silicon completing the fill of the gap. The silicon in the gap may have voids, such as seams, which may be, e.g., near the center of the gaps. Consequently, the voids may be closed volumes in the interior of the gaps.

Optionally, the silicon fill may be exposed to a silicon mobility inhibitor. The silicon fill may subsequently be annealed. Advantageously, after the anneal, the voids may be reduced in size and, in some embodiments, this reduction in size may occur to such an extent that the voids are eliminated. The anneal may fuse the amorphous silicon. It has been found, however, that if the temperature of the anneal is too high, the amorphous silicon may be crystallized. Preferably, the maximum anneal temperature is maintained at a level that does not crystallize the amorphous silicon.

Without being limited by theory, the optional silicon mobility inhibitor is believed to interact with exposed silicon to limit the movement of silicon atoms. Advantageously, the natural pinching behavior in some depositions, which can cause the formation of voids, also prevents or limits the movement of the mobility inhibitor into the voids. As a result, silicon atoms in the interiors of the filled openings are relatively free to move and to rearrange during an anneal, while the silicon atoms on the exposed surface are limited in their movements by the exposure to the mobility inhibitor. Advantageously, this difference in movement of silicon atoms allows the voids to be eliminated or reduced without roughening the exposed surface. Thus, the exposed surface remains substantially as smooth as it was immediately after being deposited.

Examples of silicon mobility inhibitors include oxygen-containing chemical species, for example oxidizing species such as oxygen ($O_2$) and oxygen-containing compounds, including NO, $N_2O$, $NO_2$, $CO_2$, $H_2O$, and alcohols. In some embodiments, the mobility inhibitor may be a semiconductor dopant such as $PH_3$, $AsH_3$, and $SbH_3$. In some embodiments, the mobility inhibitor may be a nitriding species, e.g., $NH_3$. In some embodiments, combinations of the above noted mobility inhibitors may be utilized.

Figure 2:
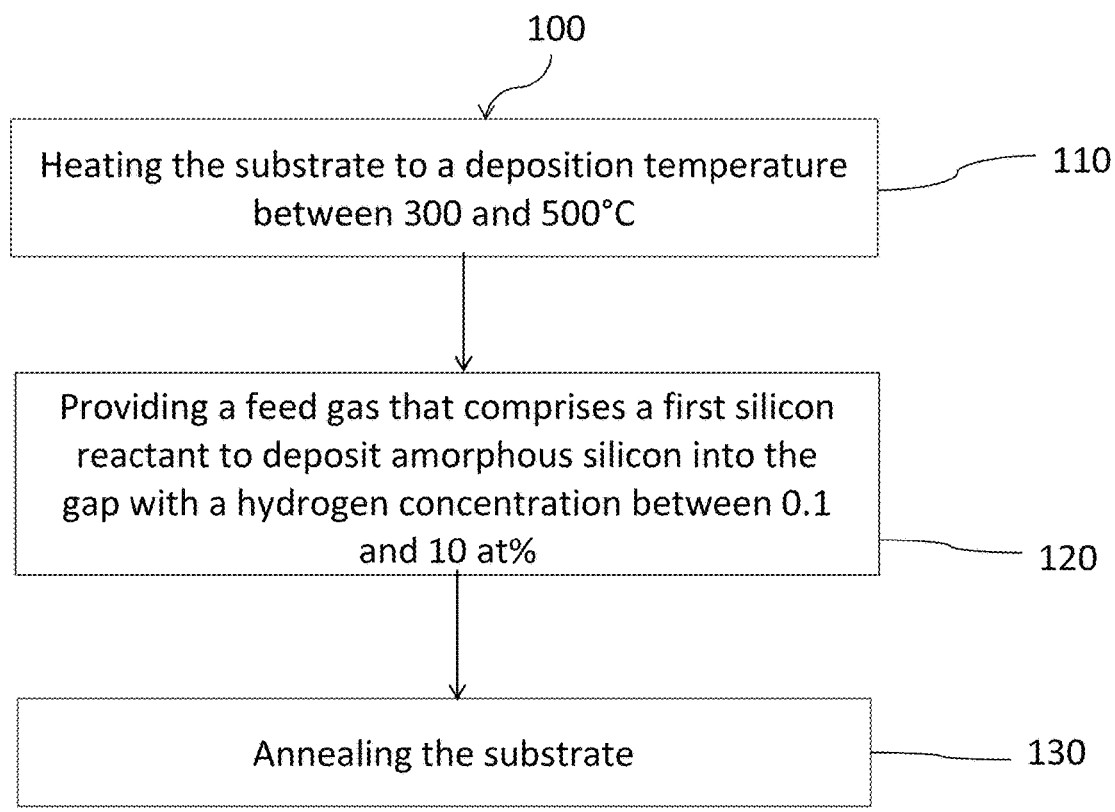
FIG. 2 is a flowchart illustrating a method of reducing voids or seams in the silicon-filled gaps.

With reference now to the drawings, FIG. 2 is a flowchart illustrating a method of reducing voids or seams in a silicon-filled gap. The method 100 includes, at block 110, heating the substrate to a deposition temperature between 300 and 500° C. In a subsequent block 120 a first silicon reactant is provided to fill the gap with a silicon film with an hydrogen concentration between 0.1 and 10 at. %, preferably between 0.5 and 5 at. %, and more preferably between 1 and 3 at. %, including about 1.5 at. %.

Optionally, the silicon film may be exposed to a silicon mobility inhibitor. In a further block 130 the silicon fill may be fused by subjecting the substrate to an anneal. The anneal may reduce or eliminate voids in the silicon fill.

It will be appreciated that the gap may be part of a semiconductor substrate such as a silicon wafer. As an example, the substrate may include a layer of material, e.g., a dielectric layer, in which the gap is disposed. In some embodiments, the gap may be an elongated trench. In some embodiments, the gap may have a width of about 100 nm or less (e.g., about 100 nm to about 5 nm), about 50 nm or less (e.g., about 50 nm to about 5 nm), or about 20 nm or less (e.g., about 20 nm to about 8 nm).

With continued reference to FIG. 2, providing 110 may simply include receiving and heating a substrate having gaps, which are then filled with silicon in block 120, for subsequent processing in block 130. For example, a silicon film may be deposited and grown in the gap in block 120. In some embodiments, the deposited film may be an organosilicon based silicon film. In some embodiments, the silicon film is not doped with a surface mobility inhibitor, such as an n-type dopant (including, phosphorus, arsenic or antimony).

In some other embodiments, the silicon film is deposited under conditions that form a hydrogen doped amorphous silicon film. For example, the deposition temperature may be sufficiently low that the silicon film grows in the amorphous state with hydrogen remaining in the film. In some embodiments, the deposition temperature may be between 300 to 500° C., between 325 to 450° C., or between 350 to 400° C. for example around 375° C. Such amorphous silicon films may advantageously be deposited with a better step coverage than as-deposited, silicon films, thereby providing smaller voids and facilitating a faster void removal in later block 130.

The silicon reactants for depositing the silicon film in the gap may include silanes with at least two silicon atoms per molecule, such as $Si_nH_{(2n+2)}$, wherein n is at least 2. Examples for such silicon reactants include one or both of disilane ($Si_2H_6$) and trisilane ($Si_3H_8$), trisilane being available from ASM International, N.V. of Almer, the Netherlands under the trademark Silcore® as used in the below example. Optionally, one or more of the hydrogen groups in the silanes may be replaced with a halogen.

An example of a process for the deposition of the amorphous silicon film may have the following conditions:
Silicon reactant: $Si_3H_8$
Flow rate: 24 sccm
Pressure: 200 mTorr
Temperature: 375° C.
Duration: 6 hours As evident from the above, the amorphous silicon film does not contain a surface mobility inhibitor.

Figure 3:
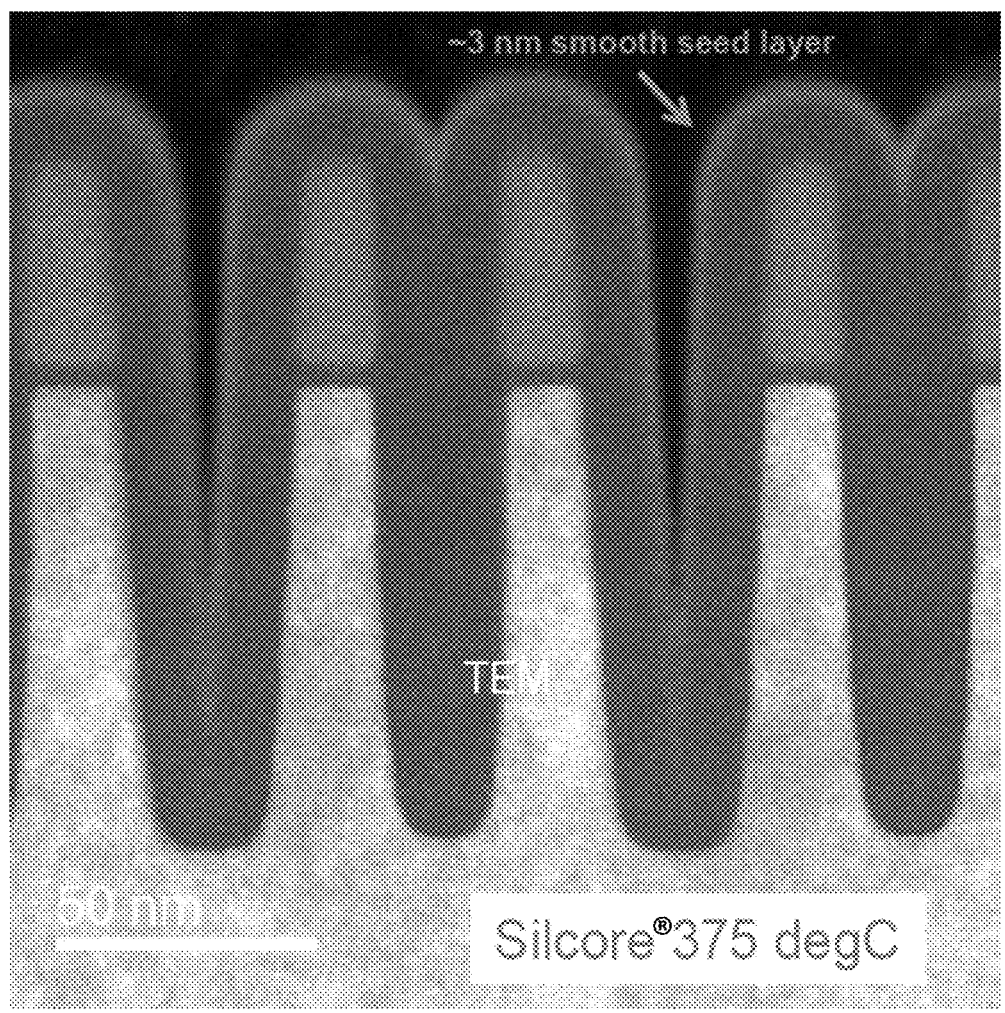
FIG. 3 depicts a TEM cross-sections of gaps which are filled using $Si_3H_8$ as a reactant.

FIG. 3 depicts gaps which were filled using $Si_3H_8$ and after 6 hours a 3 nm seed layer SL was created in the gap. As shown, the seed layer SL produced with $Si_3H_8$ was very smooth and conformal even in the smallest gap.

Figure 4:
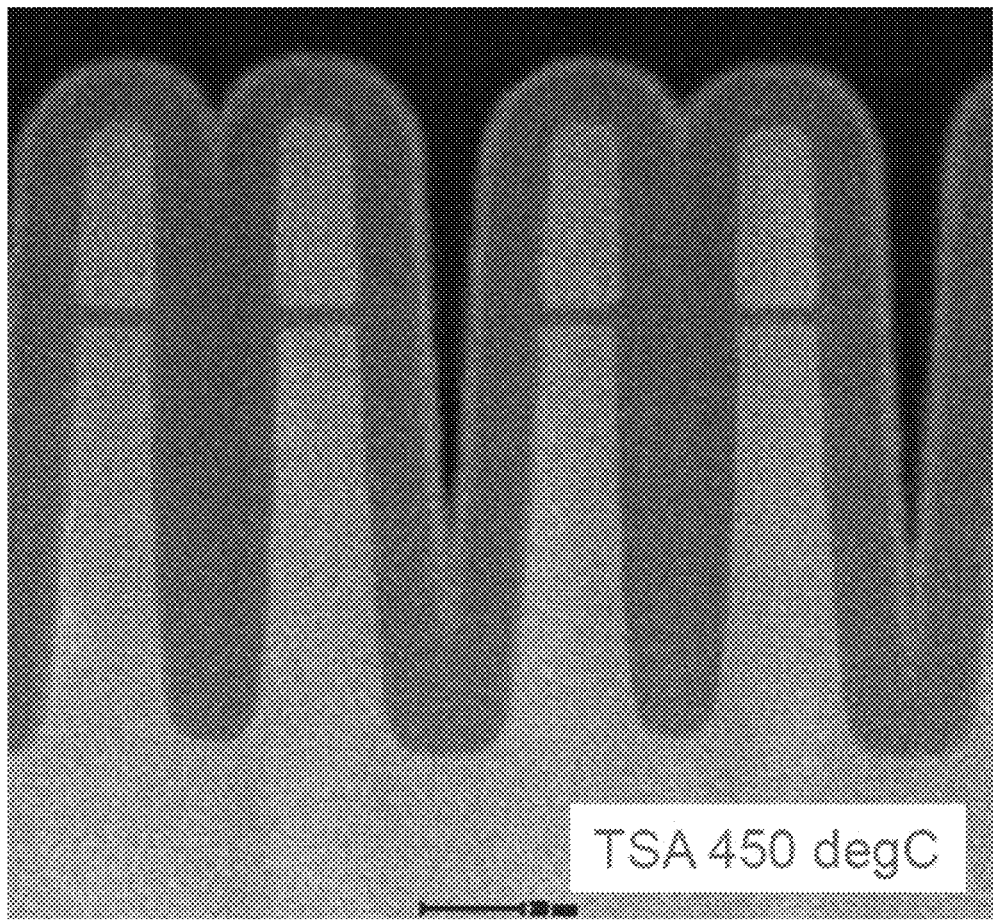
FIG. 4 depicts a TEM cross-sections of gaps which are filled using trisilylamine (TSA) as a reactant.

Alternatively, silane amines such trisilylamine (TSA) may be used as a first silicon reactant comprising at least two silicon atoms per molecule. FIG. 4 shows a gap partially filled using trisilylamine (TSA) to deposit a seed layer at 450° C. The silicon fill was also very smooth and conformal even in the smallest gap. TSA provides mainly nitrogen (N) dopants (20 at. %) and a hydrogen (H) content of a TSA-deposited layer may be between 3 and 7 at. %.

An example of a process for the deposition of a silicon film in a gap using TSA may have the following conditions:
Silicon reactant: $N(SiH_3)_3$
Flow rate: 53 sccm
Pressure: 688 mTorr
Temperature: 450° C.
Duration: 45 min To decrease the time necessary to completely fill the gap, the deposition speed may be increased during depositing the amorphous silicon film into the gap by increasing the deposition temperature to a higher deposition temperature. The higher deposition temperature may be between 350 and 600° C., preferably between 375 and 525° C., and more preferably between 400 and 450° C., including around 410° C. An initial amorphous silicon sublayer (which forms a portion of the eventual amorphous silicon film, and which may also be referred to as a seed layer) with a hydrogen concentration between 0.1 and 10 at. %, may be deposited initially at a lower deposition temperature. The initial sublayer may have a thickness between 1 to 10 nm, preferably 2 to 7 nm, including around 5 nm. The subsequent amorphous silicon sublayer deposited at the higher deposition temperature may have a decreased hydrogen concentration compared to the initial amorphous silicon sublayer deposited at the deposition temperature between 300 and 500° C. The initial and subsequent sublayers, in the aggregate, form the amorphous silicon film.

Figure 5:
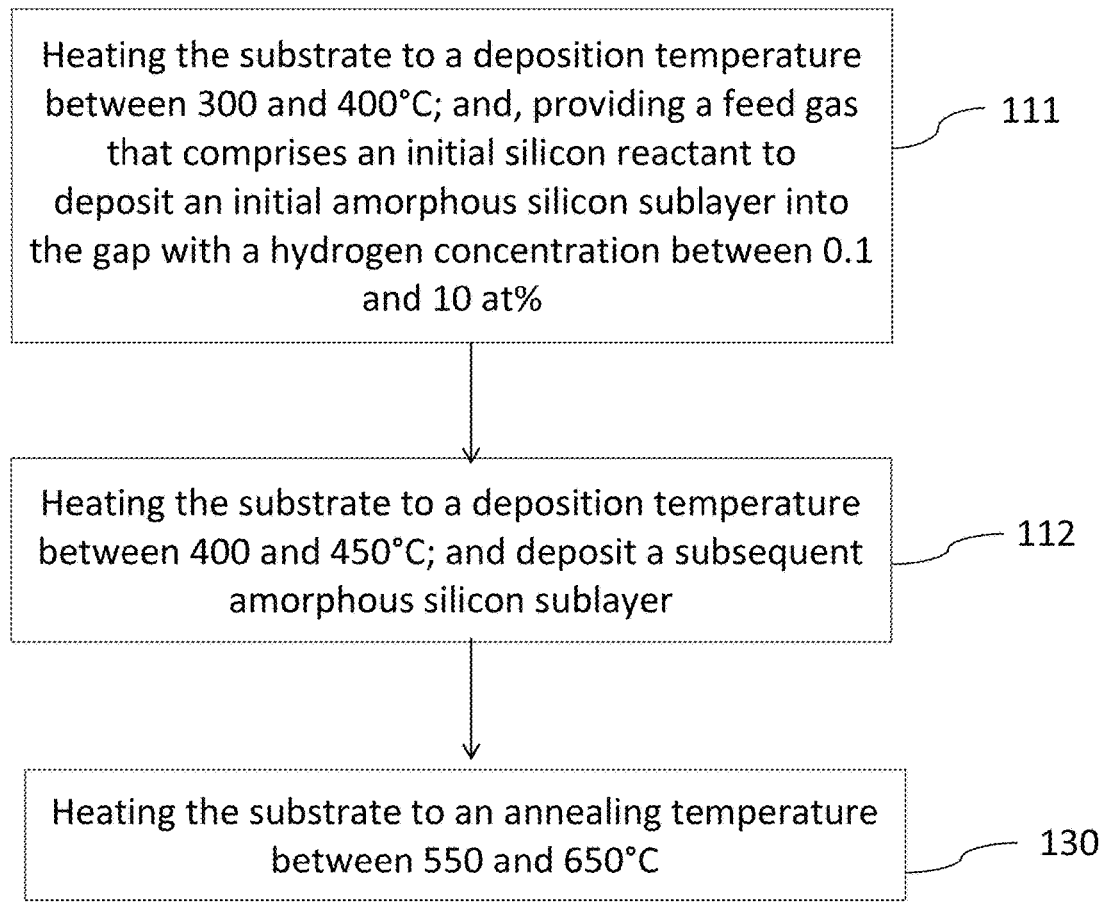
FIG. 5 is a flowchart illustrating a method of reducing voids or seams in the silicon-filled gaps at different temperatures.

FIG. 5 is a flowchart illustrating a method of reducing voids or seams in a silicon-filled gap according to a further embodiment including a change of the deposition temperature. The method includes the block 111 of heating the substrate to a deposition temperature between 300 and 500° C. and using a first silicon reactant to fill the gap with an amorphous silicon seed layer with an hydrogen concentration between 0.1 and 10 at. % preferably between 0.5 and 5 at. %, and more preferably between 1 and 3 at. %, including around 1.5 at. %. This block is similar to blocks 110 and 120 of the method of FIG. 2. The seed layer may have a thickness between 1 to 10 nm, and preferably 2 to 6 nm, including around 3 nm. In a further block 112 the substrate is heated to a deposition temperature between 400 and 450° C. and a subsequent amorphous silicon film sublayer is deposited to further fill the gap at a higher temperature with a higher speed. The amorphous silicon fill may be fused by subjecting the substrate to an anneal 130. The anneal may reduce or eliminate voids in the silicon fill.

For the anneal, the substrate may be exposed to an environment comprising nitrogen, hydrogen or any combination thereof. It has been found that, in such an environment, crystallization may be better circumvented during anneal.

Figure 6:
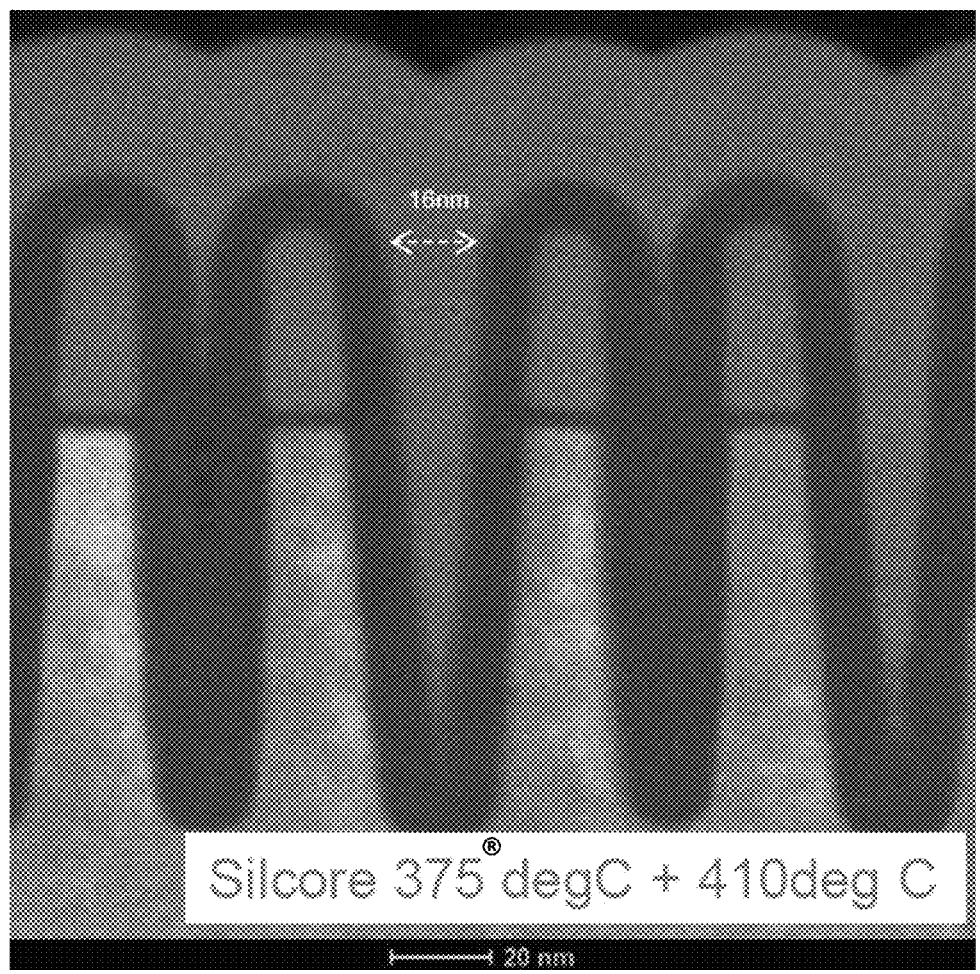
FIG. 6 depicts a TEM cross-sections of gaps which are filled using $Si_3H_8$ at a deposition temperature of 375° C. to form a seed layer and then continuing the deposition at a higher temperature of 410° C.

FIG. 6 depicts gaps which were filled using $Si_3H_8$ at a deposition temperature of 375° C. to form a seed layer and then filling the gap is continued at a higher temperature of 410° C., which can advantageously increase the deposition and fill speed. As shown, the seed layer SL (darker layer) was very smooth and conformal even in the smallest gaps after anneal 130. The fill of the gap after the seedlayer has been deposited was also very smooth and amorphous. The amorphous silicon film deposited at 410° C. has a decreased hydrogen concentration compared to the hydrogen doped amorphous silicon film deposited at the deposition temperature of 375° C.

It is believed that by providing a hydrogen doped amorphous silicon seed layer along the surface of the gap, crystallization can be inhibited also in the non-hydrogen doped amorphous silicon layer deposited at 410° C., because forming of nuclei for crystallization normally provided by the gap surface may not form due to the hydrogen doped amorphous silicon seed layer. This results in the fact that interface-induced crystallization is suppressed, also in the non-hydrogen doped Si layer.

To further decrease the time necessary to completely fill the gap, the deposition speed may be further increased during depositing the amorphous silicon film into the gap by changing to a different silicon reactant than the first silicon reactant in the feedgas. In FIG. 5 the further block 112 may therefore use another silicon reactant, for example monosilane (e.g. $SiH_4$) to further increase the speed and or lower the cost. The different silicon reactant may comprise a monosilane with one silicon atoms per molecule, such as for example $SiH_4$. Optionally, one or more of the hydrogen groups in the silanes may be replaced with a halogen. The different silicon reactant may be deposited at an increased temperature of between 350 and 700° C., preferably between 400 and 600° C. and more preferably between 450 and 550° C., including around 520° C.

The second portion (the subsequent sublayer) of the amorphous silicon film which may deposited on the $Si_3H_8$ (Silcore®) seed layer may be deposited under the following conditions:
  Silicon source: $SiH_4$
  $SiH_4$ flow rate: 660 sccm
  Pressure: 500 mTorr
  Temperature: 520° C.

Figure 7:
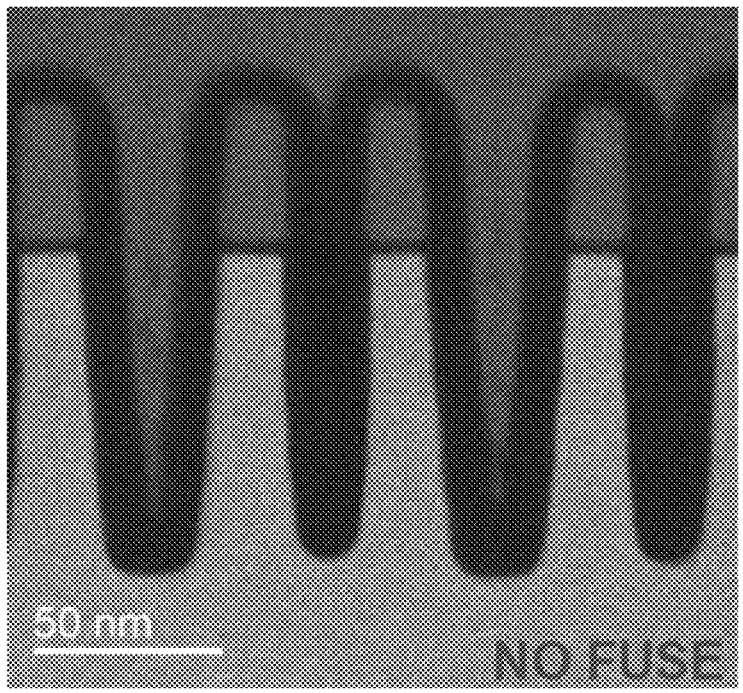
FIG. 7 depicts a TEM cross-section of gaps which are filled using $Si_3H_8$ at a deposition temperature of 375° C. to form a seed layer and then continuing the silicon deposition at a higher temperature with silane.

FIG. 7 depicts gaps which were filled using $Si_3H_8$ at a deposition temperature of 375° C. to form a seed layer, then further filling of the gap with $Si_3H_8$ at 410° C., and further increasing the total thickness of the a-Si layer using $SiH_4$ as a reactant at a deposition temperature of 520° C. to increase the speed and reduce cost. As shown, the fill was very smooth and conformal even in the smallest gaps and the seams were advantageously small before anneal. The amorphous silicon film deposited at 520° C. with $SiH_4$ as the reactant had a decreased hydrogen concentration compared to the hydrogen doped amorphous silicon seed layer deposited at the deposition temperature of 375° C.

Without being limited by theory, it is believed that by providing a hydrogen doped amorphous silicon seed layer along the surface of the gap, crystallization can be inhibited also in the non-hydrogen doped amorphous silicon layer because the nuclei for crystallization normally provided by the gap surface are covered by the hydrogen doped amorphous silicon and therefore crystallization cannot start from there in the non-hydrogen doped amorphous silicon layer.

Figure 8A:
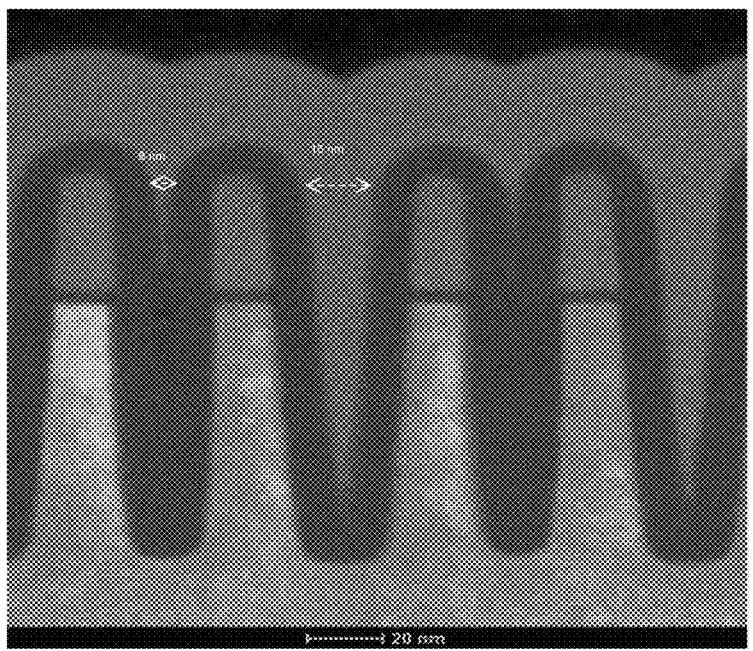
FIG. 8a depicts a TEM cross-section of gaps which are filled using $Si_3H_8$ as in FIG. 6 and conducting an anneal.

FIG. 8a depicts gaps which were filled using Silcore® (i.e. $Si_3H_8$) as an reactant at a deposition temperature of 375° C. to form a seed layer, further filling of the gap with Silcore® at 410° C. and annealing at 600° C. for 4 hours. As shown, the fill was very smooth and conformal after anneal and even in the smallest gaps and the seams were at a very low level.

Figure 8B:
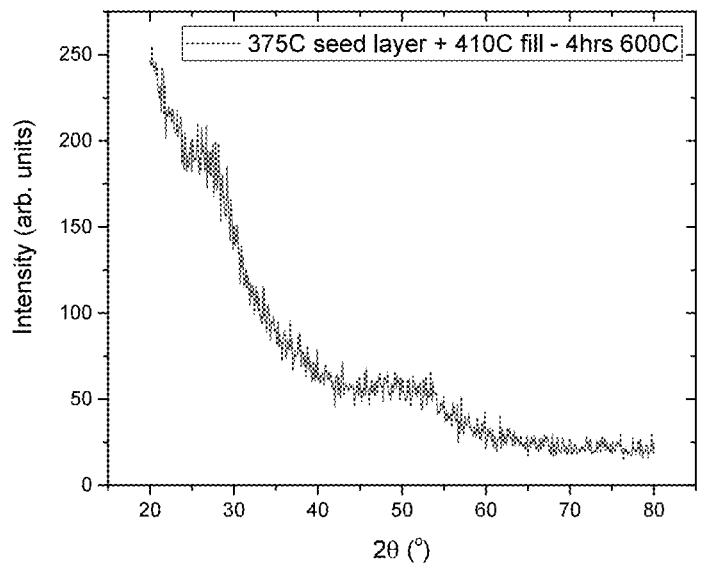
FIGS. 8b and 8c depict GIXRD measurements on the layer of FIGS. 6 and 8a before and after anneal.
Figure 8C:
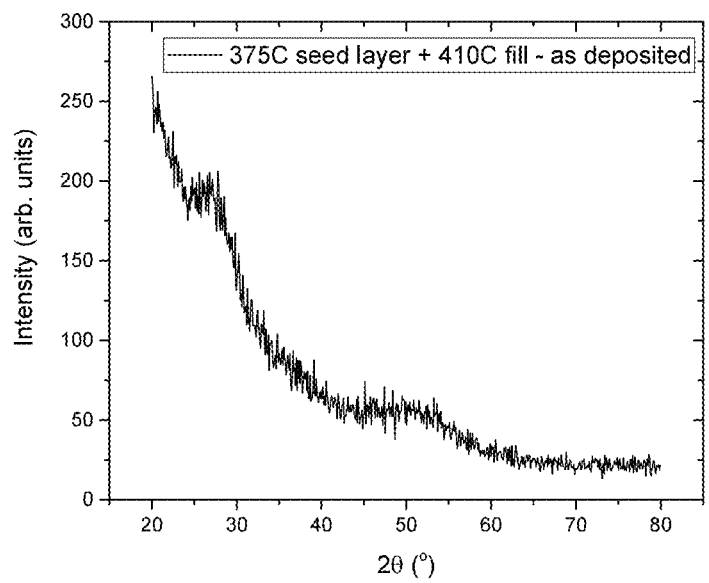

FIGS. 8b and 8c depict Grazing Incidence X-Ray Diffraction (GIXRD) measurements of the layer of FIG. 6 and FIG. 8a before (FIG. 8a) and after anneal (FIG. 8c). The GIXRD measurement before (FIG. 8a) and after anneal (FIG. 8b) were very similar, showing that the film remains amorphous after the anneal. The measurements were obtained using an XRD tool JVX7300M of Jordan Valley Semiconductors Ltd. (Migdal Ha'Emek, Israel).

Alternatively, one could provide the feed gas with a hydrogen reactant and an silicon reactant to deposit an amorphous silicon film into the gap with an hydrogen concentration between 0.1 and 10 at. %, preferably between 0.5 and 5 at. %, more preferably between 1 and 3 at. %, including around 1.5 at. %, to provide the hydrogen doped seed layer. The hydrogen reactant advantageously allows for increased control of the hydrogen concentration.

With reference again to FIG. 2, in some embodiments, providing 110 can include forming a silicon fill that incorporates a hydrogen dopant or an electrical dopant such as phosphorus or arsenic. It has been found, however, that voids in a phosphorus-doped silicon fill are not healed after being annealed (such as an anneal in a subsequent block 130, discussed below). Without being limited by theory, the phosphorus present in the doped fill and on the surfaces of the voids is believed to cause such an inhibition of movement of the silicon atoms that insufficient rearrangement takes place and fusing of the voids is not successfully accomplished.

In some embodiments, providing 110 includes filling the gap with a plurality of layers of material, with the final layer filling the gap being an amorphous silicon layer. For example, the gap may be partially filled with a silicon layer, such as an amorphous silicon layer what contains a mobility inhibitor, the layer having a thickness that is insufficient to completely fill an entire volume of the trench, leaving open an upper portion of the trench near the top of the trench in some embodiments.

In some embodiments, the mobility inhibitor is an electrical dopant, such as phosphorus or arsenic. The amorphous silicon layer may be doped by various methods, including, for example, in-situ doping. The trench is subsequently filled with an undoped amorphous silicon layer such that the trench is filled in and the top of the trench is closed. In some embodiments, the undoped amorphous silicon film has a thickness of about 5 nm or more, or 10 nm or more, which can facilitate having a sufficient quantity of material to rearrange and heal voids in the filled opening, during a subsequent anneal, as discussed herein.

It will be appreciated that silicon film deposited into the gap may fill the gap by growing on the sides and bottoms of the opening. The growth may be uneven and voids may be formed, e.g., along the centerline of the gap where films growing on opposing sides of the gap converge. For example, without being limited by theory, opposing portions of the film at upper portions of the gap, near the mouth of the gap, may converge first. This may block off further deposition in lower portions of the gap, thereby causing voids to form in the silicon fill. Thus, the filled gap may be closed at its mouth by the silicon film, but have voids in its interior.

With continued reference to FIG. 2, these voids may be eliminated or reduced in size by optionally exposing the surface of the silicon fill to a silicon mobility inhibitor during block 120 and performing a subsequent anneal 130. It will be appreciated that the silicon mobility inhibitor is a chemical species that interacts with the exposed surface of the silicon fill to stabilize or limit the movement of silicon atoms on that surface. In some embodiments, the silicon mobility inhibitor maintains the roughness of the surface at substantially the same level after the anneal 130 as before that anneal. For example, the surface roughness after the anneal 130 may be within about 10 Å, within about 5 Å, or within about 3 Å of the surface roughness before the anneal 130.

Non-limiting examples of silicon mobility inhibitors include oxygen containing species including oxidizing species such as oxygen ($O_2$) and oxygen-containing compounds, such as NO, $N_2O$, $NO_2$, $CO_2$, $H_2O$, and alcohols; nitriding species such as $NH_3$, and semiconductor dopants such as $PH_3$ and $AsH_3$. In some embodiments, combinations of oxygen-containing chemical species, nitriding species, and/or semiconductor dopants may be utilized.

In some embodiments, exposing 120 the silicon fill to the silicon mobility inhibitor may include introducing the silicon mobility inhibitor into a process chamber containing the substrate with the silicon fill. For example, the silicon mobility inhibitor may be flowed into the process chamber as a gas. In some embodiments, the process chamber is the same chamber in which the silicon fill was deposited. In some other embodiments, the substrate is removed from the deposition chamber for exposure to the silicon mobility inhibitor. For example, exposing 120 the silicon fill to the silicon mobility inhibitor may include exposing the silicon fill to the ambient air during transport from the deposition chamber to an anneal chamber for annealing 130 the silicon fill.

In some embodiments, the deposition and anneal are performed in the same process chamber and exposure to the silicon mobility inhibitor may be accomplished by unloading the substrate to expose it to air and then reloading the substrate into the process chamber. In some embodiments, depositing the silicon fill, exposing the silicon fill to the silicon mobility inhibitor, and annealing the silicon fill are all performed in the same process chamber without unloading the substrates from the process chamber in between any of these depositing, exposing, and unloading steps.

In some embodiments, the exposure to the silicon mobility inhibitor is performed at a temperature that is lower than a temperature at which the silicon atoms at the surface of the silicon fill become mobile and rearrange. As noted herein, annealing the silicon fill without exposure to the silicon mobility inhibitor can increase the roughness of the deposited silicon. To guard against such roughening, in some embodiments, the substrate is not heated above a maximum temperature above 500° C. until after exposure to the mobility inhibitor. In some embodiments, the exposure is performed at the deposition temperature. In some other embodiments, the exposure is performed at least partly during heating of the substrate from the deposition temperature to the anneal temperature.

It will be appreciated that the duration of the exposure is sufficient for the mobility inhibitor to interact with the surface of the silicon fill to prevent roughening of that surface. In some embodiments, the exposure occurs for a duration of about 1 minute or more. In some embodiments, a thin layer (e.g., a monolayer or less) of the mobility inhibitor is deposited by the exposure.

With continued reference to FIG. 2, the silicon fill may be annealed at block 130 after being exposed at block 120 to the silicon mobility inhibitor. In some embodiments the silicon fill may be annealed at block 130 also without being exposed at block 120 to the silicon mobility inhibitor. In some embodiments, the substrate may be transported to a dedicated anneal chamber to perform the anneal. In some other embodiments, the anneal may be performed in the same chamber in which the silicon fill was deposited.

The anneal temperature is generally higher than the deposition temperature and causes silicon atoms in the silicon fill to move, thereby eliminating or reducing the sizes of voids in the silicon fill. In some embodiments, the anneal temperature may be between 550 and 650° C., preferably between 575 and 625° C., including around 600° C. In some embodiments, the duration of the anneal is about 30 minutes or more, or about 60 minutes or more. Advantageously, voids in the silicon fill are not observable or made nearly undetectable by visual inspection after the anneal, while the surface of the deposited silicon remains substantially as smooth as it was before the anneal. In addition, the anneal may keep the silicon amorphous.

With reference again to FIG. 2, in some embodiments, after filling 110 of the gap by deposition of an amorphous silicon layer, and before annealing 130 at the anneal temperature, the amorphous silicon layer is patterned. For example, the amorphous Silicon layer may be patterned by forming a patterned mask over the amorphous silicon layer and etching the amorphous silicon layer through the mask to transfer the pattern in the mask to the amorphous silicon layer. Patterning the amorphous silicon layer before an anneal and crystallization of the silicon layer has the advantage that etching the lines in an amorphous layer results in a lower Line Edge Roughness than etching the lines in a polycrystalline layer.

In some embodiments, the patterning process may comprise exposing the top surface and side surfaces of the lines in the amorphous silicon layer to a silicon mobility inhibiting gas, e.g., simultaneously with exposing the amorphous silicon layer to an etch gas. In some other embodiments, exposure to the mobility inhibiting gas is performed after patterning, or defining, the lines and before the anneal at the anneal temperature. Alternatively, the amorphous silicon layer may also be patterned after an anneal of the silicon layer if the silicon layer remained amorphous during the anneal step so that etching the lines in the amorphous layer resulted in a lower Line Edge Roughness than etching the lines in a polycrystalline layer.

With continued reference to FIG. 2, in some embodiments, before start of the deposition of the amorphous silicon film to fill 110 the trench, the trench is exposed to a nucleation enhancing chemical species, e.g., in a nucleation step, to enhance the nucleation of the subsequently-deposited amorphous silicon layer. In some embodiments, the nucleation enhancing chemical species includes one or more of a silicon-containing species, a germanium-containing species, a nitrogen-containing species, and a boron-containing species. Non-limiting examples of nucleation enhancing gases include one or more gases selected from the group of $BCl_3$, $B_2H_6$, $NH_3$, $N_2H_4$, $SiCl_4$, $SiHCl_3$, $SiH_2Cl_2$, $SiH_3Cl$, $SiH_4$, $Si_2H_6$, $GeCl_4$, $GeHCl_3$, $GeH_2Cl_2$, $GeH_3Cl$, and $GeH_4$. Preferably, the substrate and trench is exposed to the nucleation enhancing chemical species under conditions that promote nucleation, and the nucleation enhancing chemical species is adsorbed on the surfaces of the trench to form nucleation sites for the subsequent deposition of the amorphous silicon layer. In some embodiments, conditions of the nucleation step for the nucleation enhancing chemical species include: a duration of the exposure to the nucleation enhancing gas of between 0.1 min and 30 min, preferable between 0.5 and 10 min; a pressure between 10 m Torr and 10 Torr, preferably about 1 Torr; and a gas flow rate, of the nucleation enhancing gas into the deposition chamber, of between 1 sccm and 1 slm, preferably between 10 sccm and 100 sccm. After the nucleation step, in some embodiments, the deposition of an amorphous silicon layer is performed at conditions that are favorable for conformal filling of the trench.

Various Figures discussed herein document experiments for forming silicon-filled openings with no or very small voids. The deposition and anneal processes were performed in an A412™ vertical furnace available from ASM International N.V. of Almere, the Netherlands. The furnace has a process chamber that can accommodate a load of 150 semiconductor substrates, or wafers, having a diameter of 300 mm, with the substrates held in a wafer boat.

It will be appreciated by those skilled in the art that various omissions, additions and modifications can be made to the processes and structures described above without departing from the scope of the invention. It is contemplated that various combinations or sub-combinations of the specific features and aspects of the embodiments may be made and still fall within the scope of the description. Various features and aspects of the disclosed embodiments can be combined with, or substituted for, one another in order. All such modifications and changes are intended to fall within the scope of the invention, as defined by the appended claims.

What is claimed is:

1. A method for producing a semiconductor device, comprising:
    providing in a deposition chamber a substrate having a gap;
    depositing an amorphous silicon film onto the substrate having a thickness sufficient to fill the gap, wherein depositing an amorphous silicon film comprises:
        heating the substrate to a deposition temperature between 300 and 500° C.; and
        providing a feed gas that comprises a first silicon reactant into the deposition chamber, wherein the first reactant deposits silicon forming the amorphous silicon film,
    wherein the amorphous silicon film has a hydrogen concentration between 0.1 and 10 at. %,
    wherein the amorphous silicon film filling the gap defines voids within the gap; and
    reducing a size of, or eliminating, the voids by annealing the amorphous silicon film at a temperature between 500 and 700° C.

2. The method according to claim 1, wherein the first silicon reactant comprises at least two silicon atoms per molecule.

3. The method according to claim 2, wherein the first silicon reactant comprises $Si_nH_{(2n+2)}$, wherein n is at least 2.

4. The method according to claim 3, wherein n is 3 and the first silicon reactant comprises trisilane.

5. The method according to claim 2, wherein the first silicon reactant comprises a silane amine.

6. The method according to claim 5, wherein the first silicon reactant comprises trisilylamine.

7. The method according to claim 1, wherein depositing the amorphous silicon film into the gap comprises increasing the deposition temperature to a relatively higher deposition temperature during depositing the amorphous silicon film.

8. The method according to claim 7, wherein the relatively higher deposition temperature is between 350 and 600° C.

9. The method according to claim 7, wherein depositing the amorphous silicon film into the gap forms an initial amorphous silicon sublayer having a thickness between 1 to 10 nm at a deposition temperature between 300 and 500° C. before the deposition temperature is increased to the higher deposition temperature.

10. The method according to claim 7, wherein the subsequent amorphous silicon sublayer deposited at the relatively higher deposition temperature has a decreased hydrogen concentration compared to an initial amorphous silicon sublayer deposited at the deposition temperature between 300 and 500° C.

11. The method according to claim 1, wherein depositing the amorphous silicon film into the gap comprises changing the first silicon reactant to a second silicon reactant different than the first silicon reactant during depositing the amorphous silicon film.

12. The method according to claim 11, wherein the second silicon reactant comprises monosilane.

13. The method according to claim 11, wherein the second silicon reactant is deposited at a relatively increased temperature of between 350 and 700° C.

14. The method according to claim 11, wherein the amorphous silicon film is deposited to a thickness between 1 to 10 nm with the first silicon reactant before the silicon reactant is changed to the second silicon reactant.

15. The method according to claim 11, wherein a portion of the amorphous silicon film deposited with the second silicon reactant has a decreased hydrogen concentration compared to a portion of the amorphous silicon film deposited with the first silicon reactant at the deposition temperature between 300 and 500° C.

16. The method according to claim 1, wherein annealing the amorphous silicon film comprises heating the substrate to a temperature between 550 and 650° C.

17. The method according to claim 16, wherein annealing the amorphous silicon film comprises providing an environment comprising nitrogen.

18. The method according to claim 16, wherein annealing the amorphous silicon film comprises exposing the substrate in an environment comprising hydrogen.

19. The method according to claim 1, further comprising exposing the amorphous silicon film to a silicon mobility inhibitor before annealing.

20. The method according to claim 1, wherein the deposition chamber is a process chamber of a batch furnace.

21. The method according to claim 1, wherein depositing an amorphous silicon film comprises performing a chemical vapor deposition process.

22. The method according to claim 1, further comprising etching the amorphous silicon film after annealing the amorphous silicon film.

23. A semiconductor device formed with a method according to claim 1 or 22.

* * * * *